(12) United States Patent
Fukase et al.

(10) Patent No.: US 10,411,214 B2
(45) Date of Patent: Sep. 10, 2019

(54) LIGHT EMITTING DEVICE, DISPLAY DEVICE, AND ELECTRONIC DEVICE

(71) Applicant: SEIKO EPSON CORPORATION, Tokyo (JP)

(72) Inventors: Akio Fukase, Chino (JP); Hidetoshi Yamamoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/037,866

(22) Filed: Jul. 17, 2018

(65) Prior Publication Data

US 2019/0036061 A1    Jan. 31, 2019

(30) Foreign Application Priority Data

Jul. 28, 2017 (JP) ................. 2017-146223

(51) Int. Cl.
| | |
|---|---|
| *H01L 29/08* | (2006.01) |
| *H01L 35/24* | (2006.01) |
| *H01L 51/00* | (2006.01) |
| *H01L 51/50* | (2006.01) |
| *H01L 27/32* | (2006.01) |

(52) U.S. Cl.
CPC ...... *H01L 51/5044* (2013.01); *H01L 51/5028* (2013.01); *H01L 27/322* (2013.01); *H01L 27/3211* (2013.01); *H01L 2251/5315* (2013.01)

(58) Field of Classification Search
USPC .................. 313/498–512; 315/169.1, 169.3; 428/690–691, 917; 438/26–29, 82; 257/40, 72, 98–100, 642–643; 427/66, 427/532–535, 53
See application file for complete search history.

(56) References Cited

U.S. PATENT DOCUMENTS

| | | |
|---|---|---|
| 8,395,314 B2 | 3/2013 | Yamamoto et al. |
| 9,293,724 B2 | 3/2016 | Fukase et al. |
| 9,401,492 B2 | 7/2016 | Yamamoto et al. |
| 9,478,763 B2 | 10/2016 | Yamamoto et al. |

(Continued)

FOREIGN PATENT DOCUMENTS

| | | |
|---|---|---|
| JP | 2011-151011 A | 8/2011 |
| JP | 2015-201279 A | 11/2015 |

(Continued)

*Primary Examiner* — Niki H Nguyen
(74) *Attorney, Agent, or Firm* — Oliff PLC

(57) ABSTRACT

Provided is a light emitting device configured to suppress deterioration in a balance of white light emission and increase a service life. The light emitting device includes a red light emitting layer, a blue light emitting layer, a green light emitting layer, a first intermediate layer configured to adjust a transfer of holes and electrons between the red light emitting layer and the blue light emitting layer, and a second intermediate layer configured to adjust the transfer of holes and electrons between the blue light emitting layer and the green light emitting layer. The intermediate layers and the blue light emitting layer each contain an assist dopant material, a concentration of the assist dopant material in the intermediate layers being greater than a concentration of the assist dopant material in the blue light emitting layer.

14 Claims, 4 Drawing Sheets

(56) References Cited

U.S. PATENT DOCUMENTS

| | | | | |
|---|---|---|---|---|
| 2009/0261360 | A1* | 10/2009 | Yasukawa | H01L 51/5044 257/89 |
| 2011/0148289 | A1* | 6/2011 | Yamamoto | C09K 11/06 313/504 |
| 2015/0188074 | A1* | 7/2015 | Heo | H01L 51/5044 257/40 |
| 2015/0287947 | A1 | 10/2015 | Yamamoto et al. | |
| 2015/0287948 | A1* | 10/2015 | Fukase | H01L 51/504 257/40 |
| 2015/0287951 | A1* | 10/2015 | Yamamoto | H01L 51/5024 257/40 |

FOREIGN PATENT DOCUMENTS

| | | |
|---|---|---|
| JP | 2015-201496 A | 11/2015 |
| JP | 2015-201497 A | 11/2015 |
| JP | 2015-201498 A | 11/2015 |
| JP | 2015-201499 A | 11/2015 |

\* cited by examiner

LIGHT EMITTING DEVICE, DISPLAY DEVICE, AND ELECTRONIC DEVICE

BACKGROUND

1. Technical Field

The disclosure relates to a light emitting device, a display device, and an electronic device.

2. Related Art

An organic electroluminescent (EL) device is a light emitting device having a structure in which a light emitting layer is disposed between an anode and a cathode. In the light emitting device, by a drive circuit, an electric field is applied between the anode and the cathode to inject electrons from the cathode into the light emitting layer and holes from the anode into the light emitting layer. The electrons and the holes then recombine in the light emitting layer, that is, carriers recombine, to generate excitons. When the excitons return to a ground state, the energy is released in the form of light. The light emitting layer normally contains a light emitting dopant material and a host material.

Furthermore, to achieve a color display, there is known a configuration in which a light emitting layer that emits red light (hereinafter denoted as "R"), a light emitting layer that emits green light (hereinafter denoted as "G"), and a light emitting layer that emits blue light (hereinafter denoted as "B") are disposed in a single light emitting device. According to this configuration, the light emitting device that includes the three light emitting layers described above is evenly formed on a substrate. According to the configuration, at least one of a method of forming different optical resonance structures by changing an optical path length on the substrate on a per RGB basis, and a method of extracting RGB light emission by forming a color filter and transmitting light through the color filter from the light emitting device is used. When the light emitting device includes each of the RGB light emitting layers, a good balance of light emission needs to be achieved from the RGB light emitting layers to achieve white light emission.

For example, JP-A-2011-151011 discloses a light emitting device provided with a first intermediate layer between a first light emitting layer and a second light emitting layer, and a second intermediate layer between the second light emitting layer and a third light emitting layer.

In the first intermediate layer and the second intermediate layer, the transfer of exciton energy between the light emitting layers, which occurs when an intermediate layer does not exist, is reduced, suppressing a bias in the light emission luminance of each RGB light emitting layer.

Further, in JP-A-2015-201499, an intermediate layer is provided merely between the first light emitting layer and the second light emitting layer. This intermediate layer contains a host material and an assist dopant material. One of the host material and the assist dopant material is a material having high electron transportability, while the other is a material having high hole transportability. As a result, the intermediate layer regulates the amount of carriers between the first light emitting layer and the second light emitting layer, suppressing a bias in the light emission luminance of each RGB light emitting layer.

However, to ensure that electrons are smoothly supplied to the first light emitting layer provided closest to the anode, a material having high electron transportability is used for the first intermediate layer, the second light emitting layer, the second intermediate layer, and the third light emitting layer. Thus, in known light emitting devices, electron transportability is high compared to hole transportability, and the position where carriers recombine (hereinafter referred to as the "recombination site") may concentrate at an interface between the first intermediate layer and the second light emitting layer. Hence, in known light emitting devices, there may be an increase in luminance deterioration in the second light emitting layer, causing a decrease in a service life.

According to the disclosure, deterioration in a balance of white light emission is suppressed, increasing a service life.

SUMMARY

A light emitting device according to an aspect of the disclosure includes a cathode, an anode, a first light emitting layer disposed between the cathode and the anode and configured to emit a first light, a second light emitting layer disposed between the cathode and the first light emitting layer and configured to emit a second light, a third light emitting layer disposed between the cathode and the second light emitting layer and configured to emit a third light, a first intermediate layer disposed between the first light emitting layer and the second light emitting layer and configured to adjust a transfer of holes and electrons between the first light emitting layer and the second light emitting layer, and a second intermediate layer disposed between the second light emitting layer and the third light emitting layer and configured to adjust a transfer of the holes and the electrons between the second light emitting layer and the third light emitting layer. The first light emitting layer, the second light emitting layer, and the third light emitting layer each include a light emitting dopant material and a host material having a hole transportability or an electron transportability, among carrier transportabilities. The second light emitting layer further includes an assist dopant material having carrier transportability different from the carrier transportability of the host material included in the second light emitting layer. The first intermediate layer and the second intermediate layer each contain at least one host material that is identical to the host material included in the second light emitting layer or the third light emitting layer. The first intermediate layer further includes an assist dopant material having carrier transportability different from the carrier transportability of the host material included in the first intermediate layer. Further, the first intermediate layer includes the assist dopant material at a concentration greater than a concentration of the assist dopant material in the second light emitting layer.

According to the first aspect of the disclosure, the assist dopant material included in the second light emitting layer has carrier transportability opposite to the carrier transportability of the host material. When the assist dopant material included in the second light emitting layer has a hole transportability, holes are smoothly transported by the cathode more readily. Moreover, the light emitting device includes the second intermediate layer that includes the same host material as the host material included in the second light emitting layer or the host material included in the third light emitting layer, allowing carriers to be smoothly transported between the second light emitting layer and the third light emitting layer. As a result, the recombination site concentrated in the second light emitting layer can be suitably widened across the second light emitting layer and the third light emitting layer. In this way, the recombination site can be sufficiently separated from a vicinity of the interface between the first intermediate layer and the second light emitting layer and deterioration of the light emitting dopant material in the second light emitting layer can be reduced, causing suppression of luminance deterioration in the second light emitting layer and increasing the service life.

Further, according to the aspect described above, the second intermediate layer may contain, among the host material included in the second intermediate layer and an assist dopant material having carrier transportability different from the carrier transportability of the host material, at least the host material. Additionally, the third light emitting layer may contain, among the host material included in the third light emitting layer, the light emitting dopant material included in the third light emitting layer, and an assist dopant material having a carrier transportability different from the carrier transportability of the host material, at least the host material and the light emitting dopant material. The second light emitting layer may contain the assist dopant material at a concentration greater than the concentration of the assist dopant in the second intermediate layer, and the second intermediate layer may contain the assist dopant material at a concentration greater than or equal to a concentration of the assist dopant in the third light emitting layer.

When this aspect is not satisfied, such as when the concentration of the assist dopant material in the second intermediate layer or the concentration of the assist dopant in the third light emitting layer is greater than the concentration of the assist dopant of the second light emitting layer, the recombination site becomes biased toward the third light emitting layer and the light emission luminance of the third light emitting layer increases excessively, causing the state to no longer be the desirable state that allows the balance of white light emission to be appropriately set by adjusting the color filter and adjusting a drive circuit. In this way, according to the aspect described above, deterioration in the balance of white light emission is more reliably reduced, increasing the service life.

Further, according to the aspect described above, the concentration of the assist dopant material in the second intermediate layer and the concentration of the assist dopant material in the third light emitting layer may be from 0 to 10%, both inclusive.

When this aspect is not satisfied, such as when the concentration of the assist dopant material in the second intermediate layer or the concentration of the assist dopant material in the third light emitting layer exceeds 10%, the desirable state that allows the balance of white light emission to be appropriately set by adjusting the color filter and adjusting the drive circuit is not achieved, causing a decrease in the light emission luminance of the second light emitting layer. In this way, according to the aspect described above, deterioration in the balance of white light emission is more reliably reduced, increasing the service life.

Further, according to the aspect described above, the second intermediate layer may have a thickness of from 3 to 6 nm, both inclusive.

When this aspect is not satisfied, such as when the second intermediate layer has a thickness of greater than 6 nm, energy transfer between the second light emitting layer and the third light emitting layer is suppressed, causing failure to achieve the desirable state that allows the balance of white light emission to be appropriately set by adjusting the color filter and adjusting the drive circuit, and thus a decrease in the light emission luminance of the third light emitting layer occurs. Further, when the second intermediate layer has a thickness of less than 3 nm, the desirable state that allows the balance of white light emission to be appropriately set by adjusting the color filter and adjusting the drive circuit is not achieved, causing an increase in the light emission luminance of the third light emitting layer. In this way, according to the aspect described above, deterioration in the balance of white light emission is more reliably reduced, increasing the service life.

Further, according to the aspect described above, a display device of the disclosure may include the light emitting device of the disclosure.

According to this aspect, a display device having a long service life can be achieved by the light emitting device in which deterioration in the balance of white light emission is suppressed, increasing the service life.

Further, according to the aspect described above, an electronic device of the disclosure may include the display device of the disclosure.

According to this aspect, the electronic device having a long service life can be achieved by the display device having a long service life.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
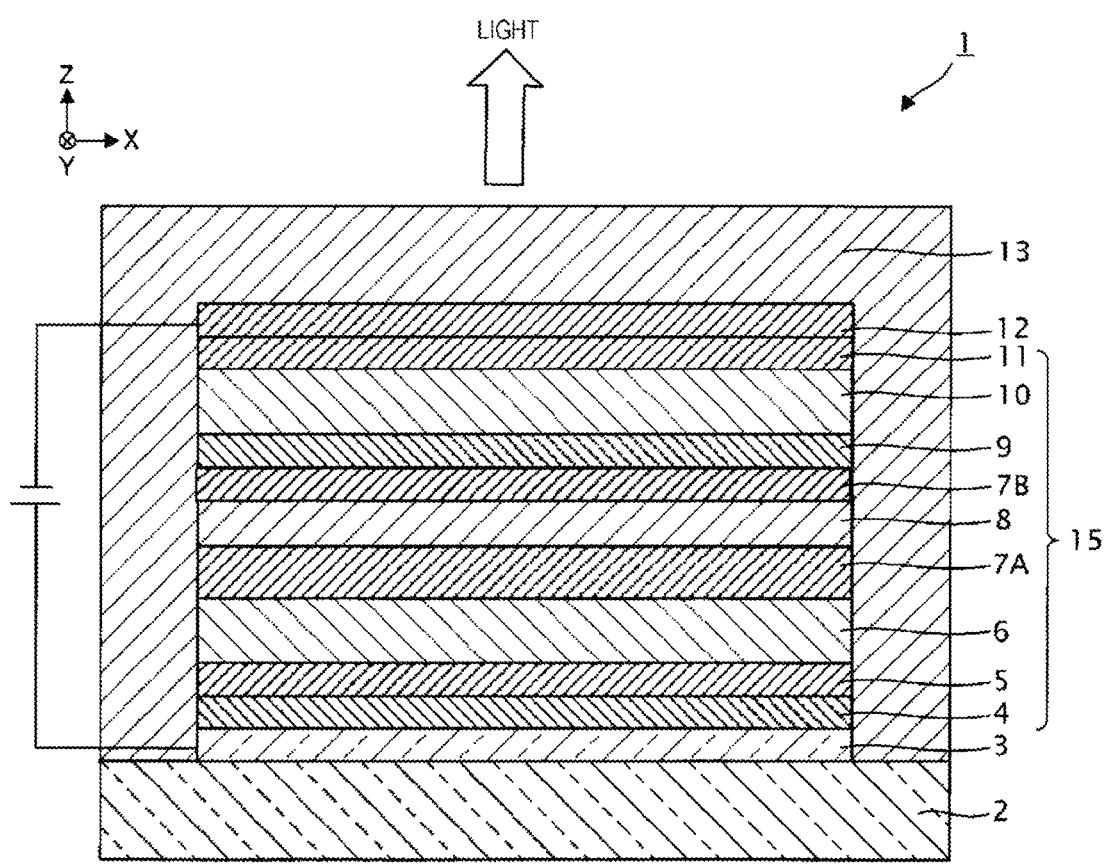
FIG. 1 is a cross-sectional diagram of a light emitting device 1 of one exemplary embodiment.

Hereinafter, modes for carrying out the disclosure will be described with reference to the accompanying drawings. However, in the drawings, the size and scale of each component suitably differ from actual ones. As the exemplary embodiment described below is a suitable concrete example of the disclosure, various technically desirable limitations are provided to the exemplary embodiment. However, the range of the disclosure is not limited to this exemplary embodiment, unless otherwise described that the disclosure is limited in the following descriptions.

A. Exemplary Embodiment

A light emitting device 1 according to one exemplary embodiment is described below.

A.1. Overview of Light Emitting Device 1

FIG. 1 schematically illustrates a cross-sectional diagram of the light emitting device 1 of one exemplary embodiment. The light emitting device 1 illustrated in FIG. 1 is a device disposed on a substrate 2. In the description below, the normal direction of the substrate 2 is referred to as the Z-axis direction (vertical direction). Furthermore, in the Z-axis direction, when seen from the inside of the substrate 2, the direction of the surface of the substrate 2 provided with the light emitting device 1 is referred to as the +Z direction, and the direction opposite to the +Z direction is referred to as the −Z direction. Furthermore, the directions orthogonal to the Z-axis direction and orthogonal to each other are referred to as the X-axis direction and the Y-axis direction. The cross-sectional diagram in FIG. 1 illustrates a cross section of the light emitting device 1 along an XZ plane.

The light emitting device 1, as illustrated in FIG. 1, includes a hole injecting layer 4, a hole transporting layer 5, a red light emitting layer 6, a first intermediate layer 7A, a blue light emitting layer 8, a second intermediate layer 7B, a green light emitting layer 9, an electron transporting layer 10, and an electron injecting layer 11 layered in that order from the −Z direction between an anode 3 and a cathode 12. The laminated body between the anode 3 and the cathode 12 constitutes a laminate 15. Furthermore, a sealing member 13 illustrated in FIG. 1 seals the anode 3, the laminate 15, and the cathode 12 so that the anode 3, the laminate 15, and the cathode 12 are not exposed to air.

In the light emitting device 1, electrons are supplied (injected) from the cathode 12 and holes are supplied (injected) from the anode 3 into the light emitting layers of the red light emitting layer 6, the blue light emitting layer 8, and the green light emitting layer 9. Then, in the light emitting layers, the holes and the electrons recombine. The energy released in this recombination generates excitons which release energy (fluorescence and phosphorescence) when returning to the ground state, causing the red light emitting layer 6, the blue light emitting layer 8, and the green light emitting layer 9 to emit R, G, and B, respectively. The light emitting device 1 thus emits white light.

The substrate 2 supports the anode 3. The light emitting device 1 according to the exemplary embodiment is configured so that light is extracted from the +Z direction (top-emission type), and hence the substrate used for the substrate 2 may be either transparent or non-transparent. When the substrate 2 is transparent, examples of the material of the substrate 2 include resin materials such as polyethylene terephthalate, polyethylene naphthalate, polypropylene, cycloolefin polymer, polyamide, polyethersulfone, polymethyl methacrylate, polycarbonate, and polyarylate; and glass materials such as quartz glass and soda glass.

Further, when the substrate 2 is non-transparent, examples of non-transparent substrates include ceramic substrates such as aluminum substrates, metal substrates such as stainless steel substrates coated with oxide films (insulating films), and resin substrates.

The substrate 2 is formed using these materials either singly or in combination of two or more.

Anode

The anode 3 is an electrode for injecting holes into the hole transporting layer 5 through the hole injecting layer 4 described later.

The material of the anode 3 may be a material having a high work function and excellent conductivity.

Examples of the material of the anode 3 include oxides such as indium tin oxide (ITO), indium zinc oxide (IZO), $In_2O_3$, $SnO_2$, Sb-containing $SnO_2$, and Al-containing ZnO; and metals such as gold, platinum, silver, copper, and alloys containing these metals. The anode 3 is formed using these materials either singly or in combination of two or more.

Cathode

The cathode 12 is an electrode for injecting electrons into the electron transporting layer 10 through the electron injecting layer 11 described later. The material of the cathode 12 may be a material having a low work function.

Examples of the material of the cathode 12 include lithium, magnesium, calcium, strontium, lanthanum, cerium, erbium, europium, scandium, yttrium, ytterbium, silver, copper, aluminum, cesium, rubidium, and alloys containing these. The cathode 12 is formed using these materials either singly or in combination of two or more (for example, a laminate of a plurality of layers).

In particular, when an alloy is used as the material of the cathode 12, the material of the cathode 12 may be an alloy containing a stable metal element such as silver, aluminum, and copper, and specifically an alloy such as magnesium silver. Use of such an alloy as the material of the cathode 12 improves an electron injection efficiency and a stability of the cathode 12.

Hole Injecting Layer

The hole injecting layer 4 has a function of improving the hole injection efficiency from the anode 3. The material (hole injecting material) of the hole injecting layer 4 is not particularly limited, and examples include copper phthalocyanine, 4,4',4"-tris (N,N-phenyl-3-methylphenylamino)triphenylamino (m-MTDATA), or N,N'-bis-(4-diphenylaminophenyl)-N, N'-diphenyl-biphenyl-4-4'-diamine). The hole injecting layer 4 is formed using these materials either singly or in combination of two or more.

Hole Transporting Layer

The hole transporting layer 5 has a function of transporting holes injected from the anode 3 through the hole injecting layer 4 to the red light emitting layer 6. The hole transporting layer 5 is formed using various p-type high molecular materials and various p-type low molecular materials either singly or in combination. Examples of the material of the hole transporting layer 5 include tetraaryl benzidine derivatives such as N,N'-di(1-naphthyl)-N,N'-diphenyl-1,1'-diphenyl-4,4'-diamine (NPD) and N,N'-diphenyl-N,N'-bis(3-methylphenyl)-1,1'-diphenyl-4,4'-diamine (TPD), and tetraaryl diaminofluorine compounds or derivatives of such compounds (such as amine compounds).

Red Light Emitting Layer

The red light emitting layer 6 contains a light emitting dopant material that emits a red light (hereinafter referred to as "red light emitting dopant material"), and a host material having, among carrier transportabilities, hole transportability or electron transportability. A carrier is a particle having the role of transferring a charge, and specifically is a general term for a hole and an electron. Then, carrier transportability refers to a property that allows carriers to be transported, and specifically is a general term for hole transportability, which is a property that allows holes to be transported, and electron transportability, which is a property that allows electrons to be transported.

The red light emitting dopant material used is not particularly limited, and various red fluorescent materials and various red phosphorescent materials may be used either singly or in combination of two or more. Examples of the red fluorescent material include perylene derivatives such as tetraaryl diindenoperylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), and 4-(dicyanomethylene)-2-methyl-6-(p-dimethylaminostyryl)-4H-pyran (DCM).

The red phosphorescent material used is not particularly limited as long as the material emits red phosphorescence. Examples include metal complexes such as those of iridium, ruthenium, platinum, osmium, rhenium, and palladium. In these metal complexes, at least one of the ligands may have, for example, a phenylpyridine skeleton, a bipyridyl skeleton, or a porphyrin skeleton.

The host material excites the red light emitting material by generating excitons through the recombination of electrons and holes and transferring the energy of the excitons to the red light emitting material (Forster transfer or Dexter transfer). To use the host material to form the red light emitting layer 6, the host material may be doped with a light emitting dopant material, for example. Examples of the materials of the host material include anthracene derivatives, naphthacene derivatives, perylene derivatives, distyrylbenzene derivatives, distyrylamine derivatives, quinolinolato metal complexes such as tris(8-quinolinolato)aluminum (Alq3), triarylamine derivatives, oxadiazole derivatives, silole derivatives, dicarbazole derivatives, oligothiophene derivatives, benzopyran derivatives, triazole derivatives, benzoxazole derivatives, and benzothiazole derivatives.

An average thickness of the red light emitting layer 6 is not particularly limited. Further, a red light emitting dopant material readily captures holes and electrons, and easily emits light because the material has a relatively small bandgap. Hence, a good balance of light emission among the light emitting layers can be achieved when the red light emitting layer 6 is disposed on the anode 3 side and the blue light emitting layer 8 and the green light emitting layer 9, which emit light less easily because each have larger bandgaps, are disposed on the cathode 12 side.

First Intermediate Layer

The first intermediate layer 7A is disposed between the layers of the red light emitting layer 6 and the blue light emitting layer 8. The first intermediate layer 7A adjusts the transfer of carriers between the red light emitting layer 6 and the blue light emitting layer 8. The first intermediate layer 7A contains the same host material as the host material contained in the blue light emitting layer 8 or the green light emitting layer 9. The first intermediate layer 7A is a non-light emitting layer that does not substantially contain material having luminescence. By adjusting the transfer of carriers, the first intermediate layer 7A allows the red light emitting layer 6 and the blue light emitting layer 8 to emit light efficiently.

Furthermore, the first intermediate layer 7A contains an assist dopant material having carrier transportability that differs from the carrier transportability of the host material contained in the first intermediate layer 7A. Specifically, when the host material contained in the first intermediate layer 7A has hole transportability, the assist dopant material contained in the first intermediate layer 7A has electron transportability. Further, when the host material contained in the first intermediate layer 7A has electron transportability, the assist dopant material contained in the first intermediate layer 7A has hole transportability.

The host material contained in the first intermediate layer 7A, being the same as the host material contained in the blue light emitting layer 8 or the green light emitting layer 9, may be an acene-based material. Further, examples of materials of the assist dopant material contained in the first intermediate layer 7A include tetraarylbenzidine derivatives, tetraaryl diaminofluorene compounds or derivatives thereof (amine compounds), oxadiazole derivatives, perylene derivatives, pyridine derivatives, pyrimidine derivatives, quinoxaline derivatives, and diphenyl quinone derivatives. The assist dopant material contained in the first intermediate layer 7A may be an amine derivative.

An amine-based material (that is, a material having an amine skeleton) is excellent in hole transportability, and the acene-based material described above (that is, the material having an acene skeleton) is excellent in electron transportability. As a result, the first intermediate layer 7A has both electron transportability and hole transportability. That is, the first intermediate layer 7A has bipolarity. With the first intermediate layer 7A having bipolarity, holes are smoothly delivered to the blue light emitting layer 8 from the red light emitting layer 6 through the first intermediate layer 7A, and electrons are smoothly delivered to the red light emitting layer 6 from the blue light emitting layer 8 through the first intermediate layer 7A. As a result, the first intermediate layer 7A efficiently injects electrons and holes into the red light emitting layer 6 and the blue light emitting layer 8 achieving the emission of light.

Blue Light Emitting Layer

The blue light emitting layer 8 contains a light emitting dopant material that emits blue light (hereinafter referred to as "blue light emitting dopant material"), and a host material having hole transportability or electron transportability. The blue light emitting layer 8 contains an assist dopant material having carrier transportability that differs from the carrier transportability of the host material contained in the blue light emitting layer 8.

The blue light emitting dopant material used is not particularly limited, and various blue fluorescent materials and various blue phosphorescent materials may be used either singly or in combination of two or more.

Examples of the blue fluorescent material include distyryl amine derivatives such as distyryl diamin compounds, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis (9-ethyl-3-carbazovinylene)-1,1'-biphenyl (BCzVBi), poly [(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], and poly[(9,9-dioctylfluorene-2,7-diyl)-co-(ethynylbenzene)].

The blue phosphorescent material is not particularly limited as long as the material emits blue phosphorescence, and examples include metal complexes such as those of iridium, ruthenium, platinum, osmium, rhenium, and palladium.

The material of the host material contained in the blue light emitting layer 8 may be the same as the material of the host material described for the red light emitting layer 6. Further, for such a host material of the blue light emitting layer 8, an acene derivative (acene-based material) may be used. As a result, the blue light emitting layer 8 emits blue at a higher luminance and a higher efficiency.

The material of the assist dopant material contained in the blue light emitting layer 8 may be any of the materials that can be used for the assist dopant material contained in the first intermediate layer 7A described above.

Second Intermediate Layer

The second intermediate layer 7B is disposed between the layers of the blue light emitting layer 8 and the green light emitting layer 9. The second intermediate layer 7B adjusts the transfer of carriers between the blue light emitting layer 8 and the green light emitting layer 9. The second intermediate layer 7B contains the same host material as the host material contained in the blue light emitting layer 8 or the green light emitting layer 9. The second intermediate layer 7B is a non-light emitting layer that does not substantially contain material having luminescence. With adjustment of the transfer of carriers, the energy transfer of excitons between the blue light emitting layer 8 and the green light emitting layer 9 is prevented, suppressing energy transfer from the blue light emitting layer 8 to the green light emitting layer 9 and allowing the blue light emitting layer 8 and the green light emitting layer 9 to emit light more efficiently. That is, the blue light emitting layer 8 and the green light emitting layer 9 emit light with a good balance, allowing the light emitting device 1 to emit white light.

Furthermore, the second intermediate layer 7B contains, among a host material and an assist dopant material having carrier transportability that differs from the carrier transportability of the host material, at least the host material. In other words, the second intermediate layer 7B contains an assist dopant material in an amount of 0 wt. % or greater. In the descriptions below, "%" indicates wt. %.

The host material contained in the second intermediate layer 7B is the same material as the host material contained in the blue light emitting layer 8 or the green light emitting layer 9, and substantially does not contain material having luminescence. The material used is not particularly limited as long as the material exhibits a carrier adjustment function such as described above. For example, for the second intermediate layer 7B, a material that contains an acene-based material may be suitably used as the same material as the host material contained in the blue light emitting layer 8 or the green light emitting layer 9.

When such a material is used, the energy level of the highest occupied molecular orbital (HOMO) in the second intermediate layer 7B can be set lower than the energy levels of the HOMOs of both the blue light emitting layer 8 and the green light emitting layer 9, and the energy level of the lowest unoccupied molecular orbital (LUMO) of the second intermediate layer 7B can be set higher than the energy levels of the LUMOs of both the blue light emitting layer 8 and the green light emitting layer 9. As a result, the energy transfer of excitons between the blue light emitting layer 8 and the green light emitting layer 9 is more reliably prevented. Thus, the blue light emitting layer 8 and the green light emitting layer 9 both emit light with high efficiency and, hence, light emission with a good balance and an increased service life of the blue light emitting layer 8 and the green light emitting layer 9 are achieved.

Further, the host material contained in the second intermediate layer 7B may be the same as the host material in the blue light emitting layer 8. As a result, carriers are smoothly delivered between the blue light emitting layer 8 and the second intermediate layer 7B, which contain the same host material, accurately suppressing or preventing a rise in a drive voltage of the light emitting device 1 and accurately suppressing or preventing dispersion of excitons.

The assist dopant material contained in the second intermediate layer 7B may be any of the materials that can be used for the assist dopant material contained in the first intermediate layer 7A described above. An amine derivative may be used as the assist dopant material contained in the second intermediate layer 7B.

Green Light Emitting Layer

The green light emitting layer 9 contains a light emitting dopant material that emits green light (hereinafter referred to as "green light emitting dopant material"), and a host material having hole transportability or electron transportability.

Furthermore, the green light emitting layer 9 contains, among a host material, a green light emitting dopant material, and an assist dopant material having carrier transportability that differs from the carrier transportability of the host material, at least the host material and the green light emitting dopant material. In other words, the green light emitting layer 9 contains an assist dopant material in an amount of 0% or greater.

The green light emitting dopant material used is not particularly limited, and examples include various green fluorescent materials and various green phosphorescent materials. These may be used either singly or in combination of two or more. Examples of the green fluorescent material include quinacridone and derivatives thereof such as quinacridon derivatives, 9,10-bis[(9-ethyl-3-carbazolyl)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-alt-co-(2-methoxy-5-(2-ethoxylhexyloxy)-1,4-phenylene)].

The green phosphorescent material is not particularly limited as long as the material emits green phosphorescence, and examples include metal complexes such as those of iridium, ruthenium, platinum, osmium, rhenium, and palladium. In these metal complexes, at least one of the ligands may have a phenylpyridine skeleton, a bipyridyl skeleton, a porphyrin skeleton, or the like.

The host material contained in the green light emitting layer 9 may be the same as the host material described for the red light emitting layer 6. Further, an acene derivative (acene-based material) may be used as the host material of the green light emitting layer 9. As a result, the green light emitting layer 9 emits green light at a higher luminance and a higher efficiency.

Further, for the host material of the green light emitting layer 9, the same host material as the host material of the blue light emitting layer 8 may be used. This allows the blue light emitting layer 8 and the green light emitting layer 9 to emit B light and G light with a good balance.

The material of the assist dopant material contained in the green light emitting layer 9 may be any of the materials that can be used for the assist dopant material contained in the first intermediate layer 7A described above.

Electron Transporting Layer

The electron transporting layer 10 has a function of transporting the electrons injected from the cathode 12 through the electron injecting layer 11 to the green light emitting layer 9.

Examples of the material (electron transporting material) of the electron transporting layer 10 include phenanthroline derivatives such as 2,9-dimethyl-4,7-diphenyl-1,10-phenanthroline (BCP), and quinoline derivatives such as organometallic complexes having 8-quinolinol or a derivative thereof as a ligand, for example, tris(8-quinolinolato)aluminum (Alq3)), azaindolizine derivatives, oxadiazole derivatives, perylene derivatives, pyridine derivatives, pyrimidine derivatives, quinoxaline derivatives, diphenylquinone derivatives, and nitro-substituted fluorene derivatives.

Electron Injecting Layer

The electron injecting layer 11 has a function of improving the electron injection efficiency from the cathode 12.

Examples of the material (electron injecting material) of the electron injecting layer 11 include various inorganic insulating materials and various inorganic semiconductor materials.

Examples of the inorganic insulating materials include alkali metal chalcogenides (oxides, sulfides, selenides, and tellurides), alkaline earth metal chalcogenides, alkali metal halides, and alkaline earth metal halides. The electron injecting layer 11 is formed using these materials either singly or in combination of two or more. These materials can be used as the main material of the electron injecting layer 11 to improve an electron injection capability. In particular, the light emitting device 1 has high luminance when the electron injecting layer 11 is formed of an alkali metal compound (such as an alkali metal chalcogenide or an alkali metal halide) because such a compound has a very low work function.

Sealing Member

The sealing member 13 is disposed covering and hermetically sealing the anode 3, the laminate 15, and the cathode 12, thus functioning to block oxygen and water. The sealing member 13 has benefits such as improving the reliability of the light emitting device 1 and preventing changes in quality and deterioration (improving durability).

Examples of the material of the sealing member 13 include aluminum, gold, chromium, niobium, tantalum, titanium, alloys of these, silicon oxide, and various resins. When the sealing member 13 is formed of a conductive material, an insulating film may be disposed, as necessary, between the sealing member 13 and the anode 3, the laminate 15, and the cathode 12 to prevent a short-circuit.

A.2. Effect of Exemplary Embodiment

Here, a concentration (hereinafter referred to as "IL1") of the assist dopant material contained in the first intermediate layer 7A is higher than a concentration (hereinafter referred to as "EML2") of the assist dopant material contained in the blue light emitting layer 8. In other words, the relationship between the two concentrations satisfies Relationship (1) below.

$$IL1 > EML2 \quad (1)$$

With satisfaction of Relationship (1), the blue light emitting layer 8 contains the assist dopant material and the assist dopant material contained in the blue light emitting layer 8 has hole transportability, making it easy to smoothly transport the holes from the cathode 12 side and suitably widen the recombination site concentrated in the blue light emitting layer 8 across the blue light emitting layer 8 and the green light emitting layer 9. Thus, the recombination site is sufficiently separated from the vicinity of the interface between the first intermediate layer 7A and the blue light emitting layer 8 and deterioration of the light emitting dopant material in the blue light emitting layer 8 is reduced, suppressing luminance deterioration of the blue light emitting layer 8 and increasing the service life. Here, while the luminance of the green light emitting layer 9 increases, the white light balance ultimately achieved can be appropriately set when the balance of the luminance of the light from the red light emitting layer 6, the blue light emitting layer 8, and the green light emitting layer 9 is within a set range by executing at least one of adjusting a color filter 19 (refer to FIG. 3) or adjusting a drive circuit, which reduces deterioration in the balance of white light emission and increases the service life.

Furthermore, IL1, EML2, a concentration (hereinafter referred to as "IL2") of the assist dopant material contained in the second intermediate layer 7B, and a concentration (hereinafter referred to as "ELM3") of the assist dopant material contained in the green light emitting layer 9 may satisfy Relationship (2) below.

$$IL1 > EML2 \geq IL2 \geq EML3 \geq 0 \quad (2)$$

When Relationship (2) is not satisfied, such as when ML3 is greater than ELM2 or IL2, the recombination site becomes biased toward the green light emitting layer 9, causing the light emission luminance of the green light emitting layer 9 to become excessively high and the balance of white light emission to significantly deteriorate. Thus, with satisfaction of Relationship (2), suppression of deterioration in the balance of white light emission and an increase in service life are more reliably achieved than when merely Relationship (1) is satisfied.

Furthermore, IL2 and EML3 may satisfy Relationship (3) below.

$$10\% \geq IL2 \geq EML3 \geq 0\% \quad (3)$$

With satisfaction of Relationship (3), suppression of deterioration in the balance of white light emission and an increase in service life are more reliably achieved than when merely Relationship (2) is satisfied. Given that Relationship (2) is satisfied and Relationship (3) is not satisfied, such as when IL2 and EML3 exceed 10%, the desirable state that allows the balance of white light emission to be appropriately set by adjusting the color filter 19 and adjusting the drive circuit is not achieved, causing a decrease in the light emission luminance of the blue light emitting layer 8.

Furthermore, the second intermediate layer 7B may have a thickness that satisfies Relationship (4) below.

$$3 \text{ nm} \leq \text{Thickness of second intermediate layer } 7B \leq 6 \text{ nm} \quad (4)$$

With satisfaction of Relationship (4), suppression of deterioration in the balance of white light emission and an increase in service life are more reliably achieved than when merely Relationships (2) and (3) are satisfied. Given that Relationships (2) and (3) are satisfied and Relationship (4) is not satisfied, such as when the thickness of the second intermediate layer 7B is greater than 6 nm, energy transfer between the blue light emitting layer 8 and the green light emitting layer 9 is suppressed, causing failure to achieve the desirable state that allows the balance of white light emission to be appropriately set by adjusting the color filter 19 and adjusting the drive circuit, and thus a decrease in the light emission luminance of the green light emitting layer 9 occurs. Further, when the thickness of the second intermediate layer 7B is less than 3 nm, the desirable state that allows the balance of white light emission to be appropriately set by adjusting the color filter 19 and adjusting the drive circuit is not achieved, causing an increase in the light emission luminance of the green light emitting layer 9.

Note that, in the exemplary embodiment, the red light is an example of the "first light", and the red light emitting layer 6 is an example of the "first light emitting layer". Further, the blue light is an example of the "second light", and the blue light emitting layer 8 is an example of the "second light emitting layer". Further, the green light is an example of the "third light", and the green light emitting layer 9 is an example of the "third light emitting layer".

A.3. Examples

Examples of the disclosure are given below. The disclosure, however, is not limited to these examples.

Figure 2:
FIG. 2 is a diagram illustrating a relationship between a balance of white light emission and a service life of an example.

FIG. 2 illustrates the relationship between the balance of white light emission and the service life of examples. Table 200 in FIG. 2 indicates, for Example A1, Example A2, Example A3, Example B1, Example B2, Example B3, and Example B4, whether Relationship (2) and whether Relationship (3) are satisfied, whether the values of IL1, EML2, IL2, and EML3 each satisfy Relationship (4), the thickness of the second intermediate layer 7B, the balance of white light emission, the service life, and the relative service life. Examples A1, A2, and A3 are examples in which Relationships (2), (3), and (4) are all satisfied. On the other hand, Examples B1, B2, B3, and B4 are examples in which one of Relationships (2), (3), and (4) is not satisfied. Here, the balance of white light emission of each of the Examples A1, A2, A3, B1, B2, B3, and B4 is the balance of white light emission when a current of 10 mA/cm$^2$ is supplied to the light emitting device 1, and is expressed as the light emission luminance the red light emitting layer 6:the light emission luminance of the blue light emitting layer 8:the light emission luminance of the green light emitting layer 9.

Further, the service life indicates the amount of time until luminance reaches 80% (LT80) of the initial luminance upon supply of a current of 100 mA/cm$^2$ to the light emitting device 1. The relative service life indicates service life given 1.00 as the service life of Example B1. Further, "Yes" in Table 200 indicates satisfaction of corresponding Relationship (2), Relationship (3), or Relationship (4) by the stated item. Similarly, "No" in Table 200 indicates non-satisfaction of corresponding Relationship (2), Relationship (3), or Relationship (4) by the stated item.

Further, in each of the Examples A1, A2, A3, B1, B2, B3, and B4, the hole transporting layer 5 is given a thickness of 40 nm. Further, the red light emitting layer 6 is given a thickness of 5 nm and contains a red light emitting dopant material having electron transportability in an amount of 1.5%. Further, the first intermediate layer 7A is given a thickness of 20 nm. The blue light emitting layer 8 is given a thickness of 15 nm and contains a blue light emitting dopant material having electron transportability in an amount of 8%. Further, the green light emitting layer 9 is given a thickness of 15 nm. Further, the electron transporting layer 10 is given a thickness of 25 nm. The cathode 12 is formed by 10:1 magnesium silver (MgAg), and is given a thickness of 10 nm.

In each of the Examples A1, A2, A3, B1, B2, B3, and B4, the balance of white light emission may be from ⅔× to 1.5× the 10:10:10 value of Example B1.

Hereinafter, this desirable state is referred to as the "desirable state of balance of white light emission".

This is because, when the balance of white light emission is from ⅔× to 1.5×, the balance of white light emission after transmission through the color filter 19 can be appropriately set by adjusting at least one of the color filter 19 and the drive circuit. Further, the service life is deemed effective when the value is at least 1.2× compared to the "437 h" value of Example B1, that is, at a relative service life of at least 1.20.

A.3.1. Example B1

Example B1 was prepared as an example in which IL1, EML2, IL2, and EML3 are given the values 50%, 0%, 0%, and 0%, respectively, the second intermediate layer 7B is given a thickness of 3 nm, which is the lower limit of Relationship (4), and, with EML2=IL2=EML3=0%, Relationship (2) is not satisfied and Relationships (3) and (4) are satisfied.

Example B1, compared to Example A1, has a good balance of white light emission, but significant deterioration in the blue light emitting layer 8.

A.3.2. Example A1

Example A1 was prepared as an example in which IL1, EML2, IL2, and EML3 are given the values 50%, 30%, 0%, and 0%, respectively, the second intermediate layer 7B is given a thickness of 3 nm, and thus Relationships (2), (3), and (4) are satisfied. The balance of white light emission of the light emitting device 1 in Example A1 is 10:8:12 and thus is the desirable state of balance of white light emission. Further, the light emitting device 1 in Example A1 has a service life of 671 hours, and a relative service life of 1.54, and thus achieves an increased service life. Among Examples A1, A2, A3, B1, B2, B3, and B4, Example A1 is the best example.

A.3.3. Example A2

Example A2 was prepared as an example in which IL1, EML2, IL2, and EML3 are given the values 50%, 30%, 0%, and 0%, respectively, the second intermediate layer 7B is given a thickness of 6 nm, which is the upper limit of Relationship (4), and thus Relationships (2), (3), and (4) are satisfied. The balance of white light emission of the light emitting device 1 in Example A2 is 10:15:7 and thus is the desirable state of balance of white light emission.

Further, the light emitting device 1 in Example A2 has a service life of 564 hours, and a relative service life of 1.29, and thus achieves an increased service life. In Example A2, compared to Example A1, the thickness of the second intermediate layer 7B is increased, resulting in a reduction in energy transfer from the blue light emitting layer 8 to the green light emitting layer 9, an increase in light emission luminance of the blue light emitting layer 8, and a decrease in light emission luminance of the green light emitting layer 9.

A.3.4. Example A3

Example A3 was prepared as an example in which IL1, EML2, IL2, and EML3 are given the values 50%, 30%, 10%, and 10%, respectively, the second intermediate layer 7B is given a thickness of 3 nm, which is the lower limit of Relationship (4), and thus Relationships (2), (3), and (4) are satisfied. In Example A3, unlike Examples A1 and A2, IL2 and EML3 are greater than 0%. The balance of white light emission of the light emitting device 1 in Example A3 is 10:7:15 and thus is the desirable state of balance of white light emission.

Further, the light emitting device 1 in Example A3 has a service life of 539 hours, and a relative service life of 1.23, and thus achieves an increased service life. In Example A3, compared to Example A1, the second intermediate layer 7B and the green light emitting layer 9 contain an assist dopant material, resulting in the recombination site being biased toward the green light emitting layer 9, causing a significant deterioration of the electron transporting material of the electron transporting layer 10, and a shortened service life.

A.3.5. Example B2

Example B2 was prepared as an example in which IL1, EML2, IL2, and EML3 are given the values 50%, 30%, 0%, and 0%, respectively, the second intermediate layer 7B is given a thickness of 7 nm, which is above the upper limit of Relationship (4), and thus Relationships (2) and (3) are satisfied, and Relationship (4) is not satisfied. The light emitting device 1 in Example B2 has a service life of 544 hours, and a relative service life of 1.24, and thus achieves an increased service life. However, the balance of white light emission of the light emitting device 1 in Example B2 is 10:17:5, and thus is not the desirable state of balance of white light emission.

Example B2 is an example in which the thickness of the second intermediate layer 7B in Example A2 is further increased. As indicated by Example B2, when the thickness of the second intermediate layer 7B is above the upper limit of Relationship (4), energy transfer between the blue light emitting layer 8 and the green light emitting layer 9 is suppressed, causing a decrease in the light emission luminance of the green light emitting layer 9 and failure to achieve the desirable state that allows the balance of white light emission to be appropriately set by merely adjusting the color filter 19 and adjusting the drive circuit.

A.3.6. Example B3

Example B3 was prepared as an example in which IL1, EML2, IL2, and EML3 are given the values 50%, 30%, 0%, and 0%, respectively, the second intermediate layer 7B is given a thickness of 2 nm, which is below the lower limit of Relationship (4), and thus Relationships (2) and (3) are satisfied, and Relationship (4) is not satisfied. The balance of white light emission of the light emitting device 1 in Example B3 is 10:6:15 and thus is not the desirable state of balance of white light emission. Further, the light emitting device 1 in Example B3 has a service life of 509 hours, and a relative service life of 1.16, and thus does not achieve an increased service life.

As indicated by Example B3, when the thickness of the second intermediate layer 7B is below the lower limit of Relationship (4), energy transfer between the blue light emitting layer 8 and the green light emitting layer 9 is greater than necessary, causing a decrease in the light emission luminance of the blue light emitting layer 8 and failure to achieve the desirable state that allows the balance of white light emission to be appropriately set by merely adjusting the color filter 19 and adjusting the drive circuit.

A.3.7. Example B4

Example B4 was prepared as an example in which IL1, EML2, IL2, and EML3 are given the values 50%, 30%, 20%, and 20%, respectively, the second intermediate layer 7B is given a thickness of 3 nm, and thus Relationship (2) is satisfied, Relationship (3) is not satisfied, and Relationship (4) is satisfied. The balance of white light emission of the light emitting device 1 in Example B4 is 10:6:16 and thus is not the desirable state of balance of white light emission. Further, the light emitting device 1 in Example B4 has a service life of 449 hours, and a relative service life of 1.03, and thus does not achieve an increased service life.

As indicated by Example B4, when Relationship (3) is not satisfied, the light emission efficiency of the blue light emitting layer 8 decreases, causing failure to achieve the desirable state that allows the balance of white light emission to be appropriately set by merely adjusting the color filter 19 and adjusting the drive circuit.

Such a light emitting device 1 as described above can be used as a light source, for example. Further, a display device 100 described later can be configured by arranging a plurality of the light emitting devices 1 into a matrix form.

Note that a drive method of the display device 100 is not particularly limited, and may be active matrix or passive matrix.

B. Modified Example

Each of the above aspects may be modified in various ways. Specific aspects of the modifications are given below as examples. Two or more aspects selected as desired from the following examples may be combined as appropriate within a range not contradicting each other. Note that, for elements in the modified example below having the same effects or functions as in the exemplary embodiment, the reference numerals used in the above description will be used again, and detailed description of the reference numerals will be omitted, as appropriate.

While the light emitting device 1 in the exemplary embodiment described above includes the three light emitting layers of the red light emitting layer 6, the blue light emitting layer 8, and the green light emitting layer 9, the number of light emitting layers may be four or greater. Further, the colors of the light emitting layers are not limited to R, G, and B of the exemplary embodiment described above. Even when there are four or more light emitting layers, white light can be omitted by setting the emission spectrum of each light emitting layer as appropriate.

Further, the intermediate layer 7 may be provided in at least one of the interfaces between the light emitting layers, and two or more intermediate layers may be provided.

C. Application Examples

The light emitting device 1 according to the exemplary embodiment described above can be applied to the display device 100 of a display panel or the like. The display device 100 including the light emitting device 1 is described below.

Figure 3:
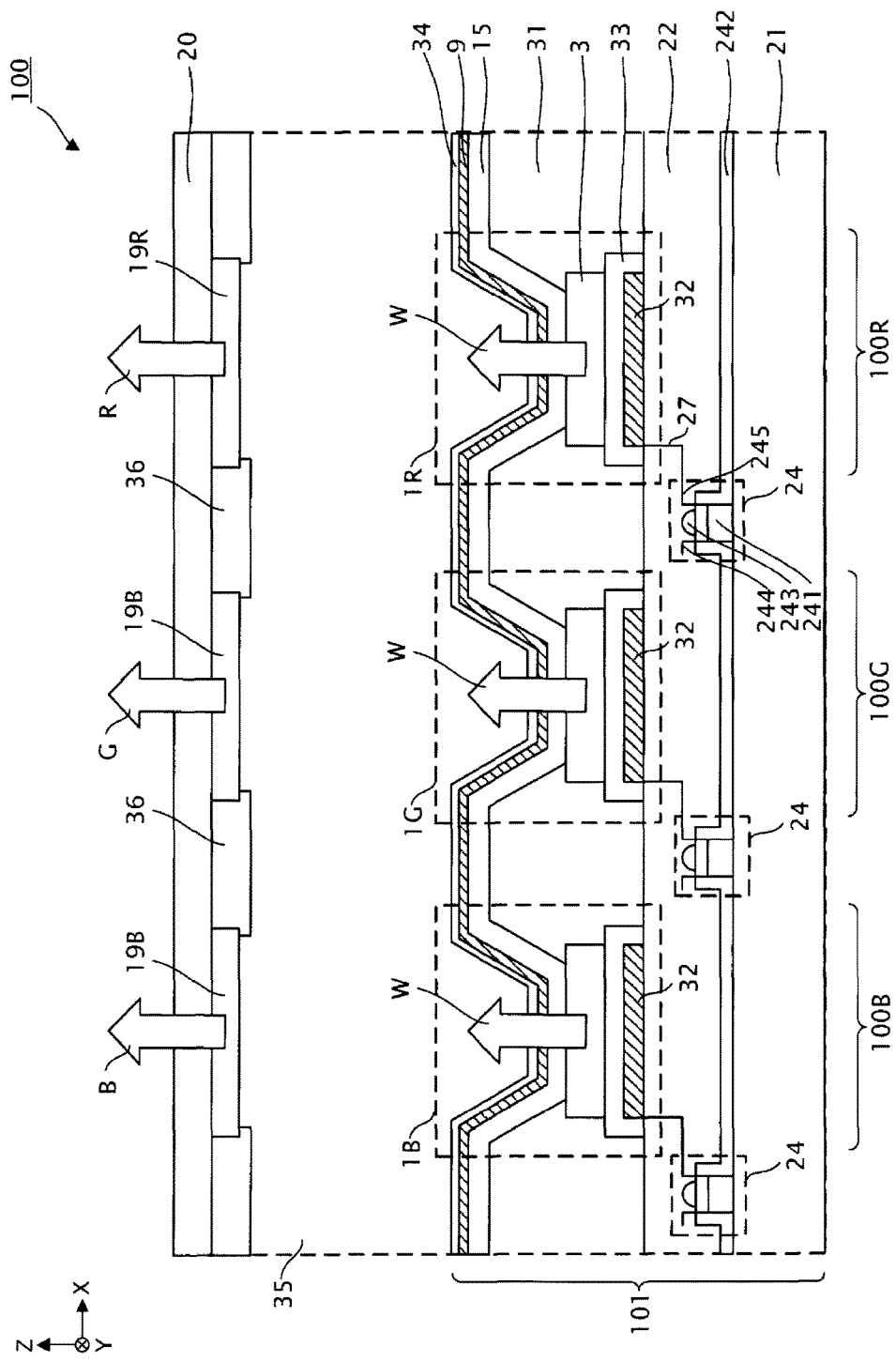
FIG. 3 is a cross-sectional diagram of a display device 100 including the light emitting device 1.

FIG. 3 is a cross-sectional diagram of the display device 100 including the light emitting device 1. The cross-sectional diagram in FIG. 3 illustrates a cross section of the display device 100 along the XZ plane. The display device 100 illustrated in FIG. 3 includes a substrate 21, a plurality of light emitting devices 1R, 1G, and 1B disposed in a corresponding manner with sub-pixels 100R, 100G, and 100B, and a plurality of driving transistors 24 for driving each of the light emitting devices 1R, 1G, and 1B.

Here, the display device 100 is a display panel having a top-emission structure.

The plurality of driving transistors 24 are provided on the substrate 21, and a planarizing layer 22 made from an insulating material is formed so as to cover these driving transistors 24.

Each of the driving transistors 24 includes a semiconductor layer 241 made from silicon, a gate insulating layer 242 formed on the semiconductor layer 241, a gate electrode 243 formed on the gate insulating layer 242, a source electrode 244, and a drain electrode 245.

The light emitting devices 1R, 1G, and 1B are provided on the planarizing layer in a corresponding manner with the driving transistors 24.

The light emitting device 1R is formed by layering a reflective film 32, a corrosion prevention film 33, the anode 3, the laminate (organic EL light emitting unit) 15, the cathode 12, and a cathode cover 34, in that order, on the planarizing layer 22. The anode 3 of each of the light emitting devices 1R, 1G, and 1B forms a pixel electrode, and is electrically connected to the drain electrode 245 of each of the driving transistors 24 by a conductive unit (wiring) 27. Note that the cathode 12 of each of the light emitting devices 1R, 1G, and 1B is a common electrode.

Note that the configurations of the light emitting devices 1G and 1B are the same as the configuration of the light emitting device 1R. Further, in FIG. 3, components that are the same as the components in FIG. 1 are denoted using like numbers. Further, the configuration (characteristics) of the reflective film 32 may be different among the light emitting devices 1R, 1G, and 1B according to the wavelengths of the light so as to form an optical resonance structure.

A partition 31 is provided between the light emitting devices 1R, 1G, and 1B that are adjacent to each other. Further, an epoxy layer 35 made from an epoxy resin is formed on the light emitting devices 1R, 1G, and 1B, covering the light emitting devices 1R, 1G, and 1B.

Color filters 19R, 19G, and 19B are provided on the epoxy layer 35 described above in a corresponding manner with the light emitting devices 1R, 1G, and 1B.

The color filter 19R converts white light W from the light emitting device 1R into a red color. The color filter 19G converts white light W from the light emitting device 1G into a green color. The color filter 19B converts white light W from the light emitting device 1B into a blue color. With use of such color filters 19R, 19G, and 19B in combination with the light emitting devices 1R, 1G, and 1B, a full color image is displayed. Further, the balance of white light emission can be appropriately set by adjusting the thicknesses of the color filters 19.

Further, a light shielding layer 36 is formed between the color filters 19R, 19G, and 19B that are adjacent to each other. This prevents the sub-pixels 100R, 100G, and 100B from emitting light unintentionally.

Then, a sealing substrate 20 is provided on the color filters 19R, 19G, and 19B and the light shielding layer 36, covering these.

Such a display device 100 as described above may be a monochromatic display or may be a color display obtained by selecting the light emitting material used for each of the light emitting devices 1R, 1G, and 1B. The display device 100 includes the light emitting device 1 of the disclosure, and thus a display device having a long service life is achieved.

Such a display device 100 may be incorporated in various electronic devices.

Figure 4:
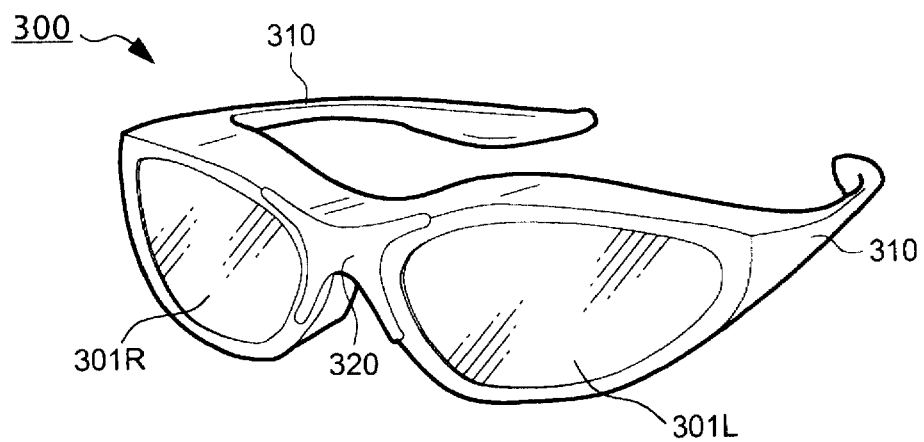
FIG. 4 is a perspective view of a head mounted display 300 according to the disclosure.

FIG. 4 illustrates a perspective outer view of a head mounted display 300 as an electronic device that uses the display device 100 of the disclosure. As illustrated in FIG. 4, the head mounted display 300 includes a temple 310, a bridge 320, a projection optical system 301L, and a projection optical system 301R. Then, in FIG. 4, the display device 100 for the left eye (not illustrated) is disposed in the projection optical system 301L, and the display device 100 for the right eye (not illustrated) is disposed in the projection optical system 301R.

Figure 5:
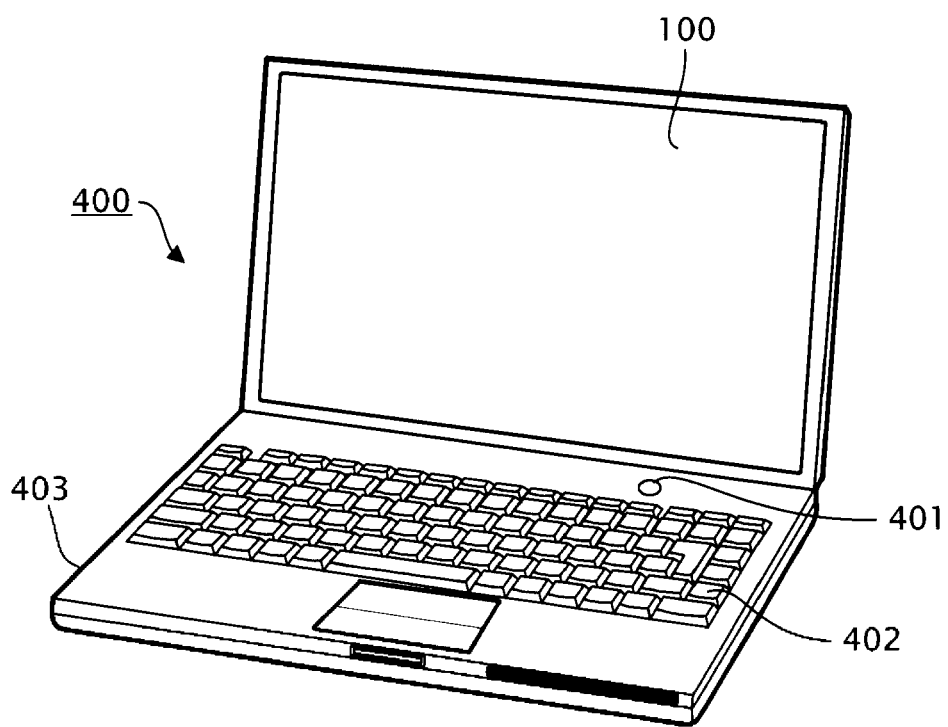
FIG. 5 is a perspective view of a personal computer 400 according to the disclosure.

FIG. 5 illustrates a perspective view of a portable personal computer 400 that uses the display device 100. The personal computer 400 includes the display device 100 configured to display various images, and a main body unit 403 provided with a power switch 401 and a keyboard 402.

In addition to the devices illustrated in FIGS. 4 and 5, examples of electronic devices to which the display device 100 according to the disclosure is applied include mobile phones, smartphones, mobile information terminals (PDAs: personal digital assistants), digital still cameras, televisions, video cameras, car navigation devices, in-vehicle display devices (instrument panels), electronic notebooks, electronic papers, calculators, word processors, work stations, videophones, and point of sales (POS) terminals. Furthermore, the display device 100 according to the disclosure may be applied to a display unit provided to electronic devices such as printers, scanners, copiers, and video players. The light emitting device 1 in the display device 100 has a long service life, allowing the electronic device provided with the display device 100 to achieve a long service life.

The entire disclosure of Japanese Patent Application No. 2017-146223 filed Jul. 28, 2017 is expressly incorporated by reference herein.

What is claimed is:

1. A light emitting device comprising:
a cathode;
an anode;
a first light emitting layer disposed between the cathode and the anode and configured to emit a first light;
a second light emitting layer disposed between the cathode and the first light emitting layer and configured to emit a second light;
a third light emitting layer disposed between the cathode and the second light emitting layer and configured to emit a third light;
a first intermediate layer disposed between the first light emitting layer and the second light emitting layer and configured to adjust a transfer of holes and electrons between the first light emitting layer and the second light emitting layer;
and a second intermediate layer disposed between the second light emitting layer and the third light emitting layer and configured to adjust a transfer of the holes and the electrons between the second light emitting layer and the third light emitting layer, wherein
the first light emitting layer, the second light emitting layer, and the third light emitting layer each include a light emitting dopant material and a host material having a hole transportability or an electron transportability among carrier transportabilities,
the second light emitting layer further includes an assist dopant material having a carrier transportability different from the carrier transportability of the host material included in the second light emitting layer,
the first intermediate layer and the second intermediate layer each contain at least one host material that is identical to the host material included in the second light emitting layer or the third light emitting layer,
the first intermediate layer further includes an assist dopant material having a carrier transportability different from the carrier transportability of the host material included in the first intermediate layer, and
the first intermediate layer includes the assist dopant material at a concentration greater than a concentration of the assist dopant material in the second light emitting layer.

2. The light emitting device according to claim 1, wherein
the second intermediate layer includes, among the host material included in the second intermediate layer and an assist dopant material having carrier transportability different from the carrier transportability of the host material, at least the host material,
the third light emitting layer includes, among the host material included in the third light emitting layer, the light emitting dopant material included in the third light emitting layer, and an assist dopant material having a carrier transportability different from the carrier transportability of the host material, at least the host material and the light emitting dopant material,
the second light emitting layer includes the assist dopant material at a concentration greater than the concentration of the assist dopant material in the second light emitting layer, and
the second intermediate layer includes the assist dopant material at a concentration greater than or equal to a concentration of the assist dopant material in the third light emitting layer.

3. The light emitting device according to claim 2, wherein the concentration of the assist dopant material in the second intermediate layer and the concentration of the assist dopant material in the third light emitting layer is from 0 to 10%, both inclusive.

4. The light emitting device according to claim 1, wherein the second intermediate layer has a thickness from 3 to 6 nm, both inclusive.

5. The light emitting device according to claim 2, wherein the second intermediate layer has a thickness from 3 to 6 nm, both inclusive.

6. The light emitting device according to claim 3, wherein the second intermediate layer has a thickness from 3 to 6 nm, both inclusive.

7. A display device comprising the light emitting device according to claim 1.

8. A display device comprising the light emitting device according to claim 2.

9. A display device comprising the light emitting device according to claim 3.

10. A display device comprising the light emitting device according to claim 4.

11. A display device comprising the light emitting device according to claim 7.

12. A display device comprising the light emitting device according to claim 8.

13. A display device comprising the light emitting device according to claim 9.

14. A display device comprising the light emitting device according to claim 10.

* * * * *